United States Patent [19]

Nacci et al.

[11] 4,359,516

[45] Nov. 16, 1982

[54] MAGNETIC RESIST PRINTING PROCESS, COMPOSITION, AND APPARATUS

[75] Inventors: George R. Nacci; Donald G. Pie, both of Wilmington, Del.

[73] Assignee: E. I. Du Pont de Nemours and Company, Wilmington, Del.

[21] Appl. No.: 209,195

[22] Filed: Nov. 21, 1980

Related U.S. Application Data

[60] Division of Ser. No. 130,424, Mar. 14, 1980, which is a division of Ser. No. 15,799, Mar. 2, 1979, abandoned, which is a continuation-in-part of Ser. No. 890,973, Mar. 28, 1978, abandoned.

[51] Int. Cl.³ .................... G03G 19/00; G03G 9/14
[52] U.S. Cl. .................................... 430/106.6; 430/39; 430/903; 430/49; 252/62.54; 252/62.55; 524/543; 524/605
[58] Field of Search ............ 430/107, 111, 122, 39, 430/106.6, 903; 252/62.54, 62.55; 260/37 M

[56] References Cited

U.S. PATENT DOCUMENTS

| | | | |
|---|---|---|---|
| 2,297,691 | 10/1942 | Carlson | 430/120 X |
| 3,239,465 | 3/1966 | Rheinfronk | 430/107 X |
| 3,558,492 | 1/1971 | Proskow | 430/107 X |
| 3,681,106 | 8/1972 | Burns et al. | 430/110 |

*Primary Examiner*—John D. Welsh

[57] ABSTRACT

A process of forming an image of toner on a latent magnetic image in a magnetic member followed by direct transfer to and coalescence on a surface to form a resist is disclosed. The surface portion not protected by the transferred resist toner image is then permanently modified by etching or plating. Chemically milled shapes are prepared as well as printed circuits and printing plates. The printed circuits may be formed by (1) etching away areas of a metal surface not protected by the resist, (2) electroless plating on areas not protected by the resist or (3) electroplating areas of a metal surface not protected by the resist, removing the resist, and in the case of (2) and (3), etching away the metal previously covered by the resist. An especially useful toner which forms a resist composition comprises a binder of thermoplastic resin and plasticizer and magnetic material present in the binder, compounded to have a tack transfer temperature of no greater than 110° C.

13 Claims, 2 Drawing Figures

F I G. 1
F I G. 2
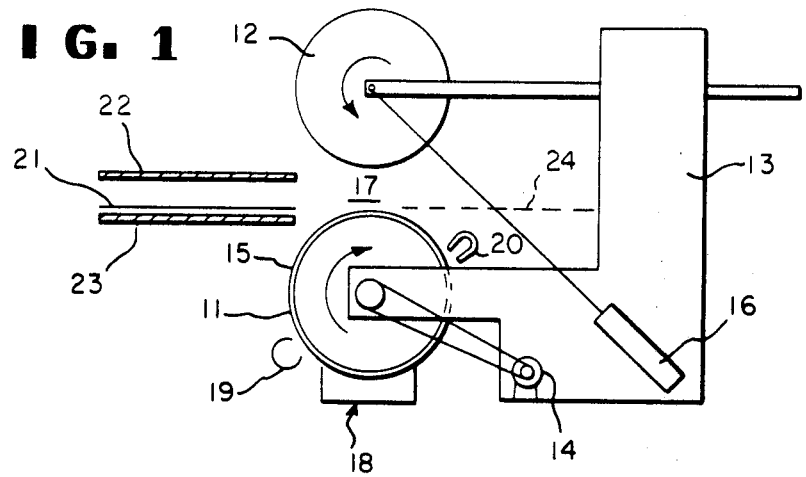
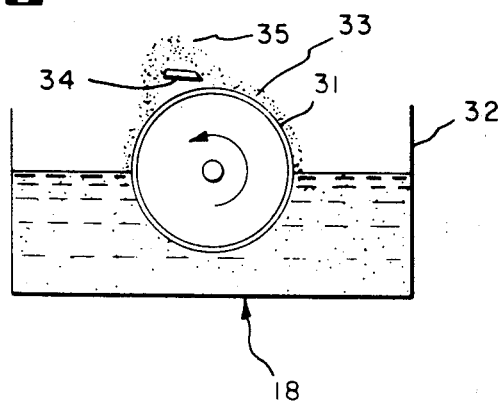

MAGNETIC RESIST PRINTING PROCESS, COMPOSITION, AND APPARATUS

This is a division of application Ser. No. 130,424 filed on Mar. 14, 1980 which in turn is a division of Ser. No. 15,799, filed Mar. 2, 1979 now abandoned which in turn is a continuation-in-part of application Ser. No. 890,973 filed on Mar. 28, 1978 now abandoned.

TECHNICAL FIELD

The present invention is a process of thermally transferring magnetically-held toner from a magnetic member to a substrate with coalescence of the toner on the substrate and a composition for use as a toner in such process. The transferred toner is capable of serving as a resist in making printed circuit boards, printing plates, or in chemical milling.

BACKGROUND ART

Printed circuits are commonly made by depositing a resist on a substrate either in the form of the desired pattern or as an overall covering followed by removal of some resist to form the desired pattern, followed by modification of the bare adjacent areas of the substrate through etching or plating.

Conventional printing methods such as letterpress, lithography, and gravure printing have been found to be deficient for resist printing, however, because they are only capable of printing a thin resist. Thin resist patterns tend to be full of pinholes which lead to unacceptable quality upon subsequent etching or plating. This is a particularly severe problem in plating because of the formation of plating nodules over pinholes in the resist. Use of liquid photoresists presents the same problem.

Two methods are now in commercial use—screen printing and photoprinting—because they are able to deposit pinhole-free resist patterns. Photoprinting, as described in Celeste U.S. Pat. No. 3,469,982, requires the lamination and subsequent exposure and development of each substrate with a suitable photopolymer. While this process provides the highest quality resists and has many advantages, the expense of the materials and exposure and development steps detract from low cost rapid reproduction. Screen printing is low in ink cost but it requires a costly set-up for the master; furthermore, it has only been implemented as a flat-bed process requiring extensive operator interaction to maintain registration and correct ink viscosity. The screening also limits edge definition. Further, the process requires post-curing.

Attempts have been made to apply xerography (electrophotographic printing or imaging by electrostatically-held toner) to the resist art. By way of background in the xerography art, thermal transfer of electrostatic toner to paper has been practiced in the past. Generally, the heat was applied after the transfer of the toner, as described in U.S. Pat. Nos. 2,990,278; 3,013,027; 3,762,944; 3,851,964 and 4,015,027. Simultaneous heating and transfer of electrostatic toner to paper is disclosed in U.S. Pat. No. 3,592,642. U.S. Pat. No. 2,917,460 discloses the melting of the electrostatic toner on the paper surface so that the molten droplets so formed may be absorbed in the interstices of the paper to make a permanent image on the paper.

As applied to the resist art, however, xerography has taken a different approach. U.S. Pat. No. 2,947,625 discloses formation of an electrostatically-held image of toner, transfer of this image to a wet gelatin-coated paper using pressure which imbeds the toner in the gelatin coating, and exposing the toner image to the softening action of solvent vapors, and pressing the solvent vapor-softened toner image against a printed circuit board to transfer a stratum of the resultant tacky image to the board, and finally subjecting the transferred image to more solvent vapors or heat to coalesce the image, which is then purportedly available as an etching resist. U.S. Pat. No. 3,061,911 discloses a similar process except that the image is transferred from the transfer paper to the circuit board by electrical charging and the resultant transferred image is fused by exposure to solvent vapor. A transfer process has been commercialized, with only limited success, involving electrostatic transfer of an image of electrostatically held toner to a tissue, electrostatically transferring the image from this tissue to a circuit board, and fusing the image with solvent vapor.

In the magnetic printing art, U.S. Pat. No. 3,965,478 discloses preheating of paper to which an image of magnetic toner is transferred under pressure, followed by additional heating to melt the toner and cause it to become impregnated into the paper surface. U.S. Pat. No. 4,067,018 discloses that in order to get a high quality image on unheated paper, free of smearing or smudging, that one or at most 1½ layers of magnetic toner particles should be adhered to the magnetic imaging member.

As applied to the circuit making art, U.S. Pat. No. 3,880,689 discloses the magnetic printing of catalyst-sensitized toner particles in a circuit pattern onto an adhesively-coated film, followed by electroless plating of the circuit pattern to form a printed circuit. This patent also discloses that the image can be printed onto a circuit board, but this would have the disadvantage of the existence of a toner layer between the electroless plating and the circuit board. U.S. Pat. No. 3,120,806 discloses the use of a magnetic pattern placed beneath a circuit board to attract fusible metal toner to the circuit board in the pattern of the magnetic pattern, to form the circuit directly therefrom.

As applied to the resist art, U.S. Pat. No. 3,650,860 discloses a process for using magnetic toner to make a resist image. In this process, a magnetizable layer is deposited on the conductive metal substrate and this layer is imagewise heated above its Curie temperature to form a latent magnetic image in the layer. This is followed by applying a dispersion of a magnetic toner, made of ferromagnetic material dispersed in binder, in a solvent for the binder to the latent magnetic image and drying the dispersion, which thereby forms a resist image corresponding to the latent magnetic image. The bare portion of the magnetizable layer and corresponding underlying conductive metal substrate can then be etched away to form a printed circuit of the remaining conductive metal substrate. Among the disadvantages of this process is the consumption of the magnetizable layer for each printed circuit made and the necessity to use solvent to convert the magnetic toner to a liquid medium and subsequent evaporation of the solvent.

DISCLOSURE OF THE INVENTION

The present invention provides a resist process involving magnetic imaging which overcomes shortcomings of the resist art, in having the advantage of a quick set-up time for the image master (magnetic member)

which is not consumed in the process, providing thick, pinhole-free resist images, providing a high rate of forming such images, such as in a rotary press without requiring the use of solvent, utilizing a stable material requiring no performance monitoring by an operator and providing high quality resist images with excellent edge definition. The present invention also provides resist compositions and apparatus which are especially useful in the process of this invention.

The process of the present invention involves forming a magnetically held image of toner and transferring this image to a substrate by means of heat and pressure. The heat is supplied to the process by preheating the substrate receiving the toner. Surprisingly, the transferred toner forms an image on said substrate which is useful as a resist in such processes as making printed circuit boards, printing plates, or in chemical milling, i.e., the process can involve the steps of (a) transferring a magnetically held image of coalescible magnetic particles from a magnetic member to a suitable surface to form a coalesced resist image, (b) modifying the exposed areas of the surface which are unprotected by the resist image, and (c) optionally removing the resist image from the surface-modified product. The modification can be to make the exposed surface hydrophilic or hydrophobic, opposite to the characteristic of the resist image, in which case the resultant product could be used as a lithographic printing plate. The modification can be to etch or deposit a metal on the exposed surface of the substrate to form the desired electrical circuit as a network of metallic conductors on an insulating background of suitable dimensions. In chemical milling (etching), the interconnecting metallic network is either self-supporting or it may be attached to a suitable substrate.

The resist composition of the present invention, which is useful as the toner in the process of the present invention, can be described as follows: a dry particulate resist composition of particles having an average size up to 30 μm for substantially instantaneous application to a heated surface of metal or the like to form resist image capable of withstanding liquid treatment media for said surface, comprising (a) binder consisting essentially of a thermoplastic resin and up to 40% based on the weight of said binder of plasticizer for said resin, and (b) magnetic material in particulate form present in said binder rendering the particles of said composition magnetically attractible, the combination of said binder and said magnetic material being substantially non-blocking at 20° C. and being adherent to said surface upon said application to said metal surface and coalescible thereon to form said resist image, said magnetic material constituting from 40 to 80% by weight of the combination of (a) plus (b) and said binder constituting the remainder.

The apparatus of the present invention can be described as follows:

Apparatus for forming a resist image onto a circuit board comprising means for defining a movable magnetic member for incorporating a latent magnetic image for development by toner, means for heating the surface of a circuit board, means for moving the heated circuit board and magnetic member together and pressing the heated surface of said circuit board against the developed latent magnetic image during said movement to transfer said image to said heated surface to form a resist image on said heated surface, said heating means being positioned just upstream of said moving and pressing means.

BRIEF DESCRIPTION OF THE DRAWINGS

FIG. 1 is a schematic side view of the apparatus used for forming a resist image according to the present invention.

FIG. 2 is a schematic side view of the decorator used to apply toner to the magnetic member used in the present invention.

DETAILED DESCRIPTION OF INVENTION AND BEST MODE

The steps in the process of the invention may be understood by referring to the attached FIGS. 1 and 2 which illustrate schematically the magnetic printing and thermal transfer machine used in most examples of the invention.

Referring now to FIG. 1, two rolls, 11 and 12, each five inches (12.7 cm) in width and in diameter are mounted one above the other in a metallic frame, 13. The lower roll, 11, is referred to as the printing roll, and it can be rotated by means of a variable speed drive motor, 14. The printing roll is surfaced with magnetic member 15 which is a film consisting of a layer of hard (permanent) magnetic material such as discussed below on a polyethylene terephthalate film support and is backed with a thin layer of resilient material such as neoprene. The upper roll, 12, is referred to as the pressure roll. It is movable and is fitted with a piston device, 16, which controls the pressure exerted by roll 12 on the printing roll, 11, and forms the nip, 17, in operation.

The desired circuit design is imaged to form a magnetic image in magnetic member 15. The imaged film can also be referred to as the movable printing member. Alternatively, the printing may be carried out with an endless belt of the magnetic member material adapted to be pressed against the printed circuit board by a roll similar to roll 11, which endless belt would be kept taut about roll 11 by one or more additional rolls.

Below the printing roll, a toner applicator, 18, is attached which is used to form a fluidized bed of dry magnetic toner. The position of 18 is adjustable to permit the fluidized toner to be brought into contact with the lower surface of the printing roll, 11, bearing the printing member. Referring now to FIG. 1, the toner applicator, 18, consists of a revolving roll having a magnetic surface 31, which dips into the toner reservoir, 32. Toner 33 is carried upward to a doctor knife, 34, which engages toner loosely held by revolving roll 31 and forms a standing wave of toner which comes into contact with magnetic member 15. At a roll surface speed of 40–100 ft/min (20.3–50.8 cm/sec) and a roll-to-blade spacing of 2 to 5 mils (0.051 to 0.127 mm), the toner is doctored from the roll and forms a fluidized standing wave, 35, 30–100 mils (0.762–7.62 mm) deep before it drops back to the roll. When this applicator 18 is brought up to the rotating printing roll, 11, bearing the magnetic member, the fluidized toner impinges on it and tones it, i.e., the magnetic member becomes decorated with the toner in the magnetized area of the magnetic member.

An AC corona static discharge unit, 19, is located near the magnetic member 15. The function is to dissipate static charge on the toner particles on magnetic member 15 after toning. Another unit 19 (not shown) can be located upstream of applicator 18 to eliminate static charge on the surface of the magnetic member before toning. This double action can be accomplished with a single unit by operating the machine in stepwise fashion instead of the continuous operation permitted by using two units 19 as described above.

A combination of air knife - vacuum knife 20, located after the toner applicator 18, cleans the toned film of background toner before thermal transfer. In the embodiment shown, the toner image is rotated past the knife 20 before the transfer step. For continuous operation this combination air knife - vacuum knife 20 can be located between the toner applicator and the nip 17. The air knife blows air vertically at the film through a 10-mil (0.254 mm) slot while the vacuum knife causes a shearing air flow at the surface of the $CrO_2$ film thereby dislodging background toner. The clearance between the knife and the film controls the air dynamics at the film surface. A clearance of 25-50 mils (0.635-1.27 mm) is very effective. Background toner is that which is adhering to the demagnetized areas of the $CrO_2$ film. An air knife alone, or a vacuum knife alone or in combination with these two elements can be used for this purpose. The vigor of the cleaning process is controlled by the magnitude of air velocity, vacuum, proximity of the knife to the film and the film speed.

A 3"×6" (7.62 cm×15.24 cm) circuit board composite, 21, is preheated between hot plates, 22 and 23, just upstream from the nip between the rolls in the diagram. The hot board is pushed into the nip, 17, between rolls 11 and 12. The board is rolled through the nip so that it comes into momentary contact with and moves together with the decorated magnetic member, so that toner is pressed against the board and is adhesively transferred to the board and simultaneously fixed thereon. The printed board emerges to the right of the nip, as indicated by 24.

Magnetic Member and Imaging Thereof

A printing member such as an endless belt, flexible film or platen is provided with a surface capable of containing a magnetic image. The magnetic material forming the surface generally will be a particulate hard magnetic material in a binder. Suitable hard magnetic materials include the permanent magnetic materials such as the "Alnicos", the "Lodexes" (acicular iron-cobalt alloys encased in lead or plastic; manufactured by General Electric Company), the "Indox" barium ferrite compositions, and materials used in tape recording, magnetic discs, and magnetic printing inks. These latter materials include $\gamma$-iron oxide ($Fe_2O_3$), magnetite (black $Fe_3O_4$), $\chi$-iron carbide and chromium dioxide. Acicular chromium dioxide is generally preferred because of its magnetic properties. The magnetic member preferably is a drum in which case the imaging surface may be an integral part of the drum or it may be a flexible film coated with the magnetic material and mounted on the drum.

Any method for forming a latent magnetic image in the magnetic member is useful in the present invention. The image is latent in the sense that it is not visible to the naked eye until decorated with magnetic toner which develops the image.

When using thermal imaging to create the latent magnetic image, the surface is magnetically structured by one of several methods with from about 100 to 1000 magnetic lines per inch (39.4 to 393.7 per cm) and preferably from 150 to 600 magnetic lines per inch (59.1 to 236.2 per cm). As used herein, a magnetic line contains one north pole and one south pole. The technique of roll-in magnetization can be used to structure the surface of the magnetic member, wherein a high permeability material such as nickel, which has been physically discretely structured to the desired width is placed in contact with the surface of the magnetic member, which previously has been magnetized in one direction by a permanent magnet or a DC electromagnet, and a DC electromagnet or permanent magnet with the polarity reversed is placed on the backside of the permeable material. As the structured high permeability material is brought into contact with the magnetic member, the nickel or other permeable material concentrates the magnetic flux lines at the points of contact causing polarity reversal at these points and resulting in a structured magnetization of the magnetic member.

The surface of the magnetic member can also be thermoremanently structured by placing the magnetic member having a continuously coated surface of magnetic material on top of a magnetic master recording of the desired periodic pattern. An external energy source then heats the surface of the magnetic member above its Curie temperature. As the surface of the magnetic member cools below its Curie temperature, the periodic magnetic signal from the magnetic master recording thermoremanently magnetizes it. When acicular chromium dioxide is used as the magnetic material in the surface of the magnetic member, as little as 20 oersteds can be used to structure the surface of the magnetic member when passing through the Curie temperature whereas over 200 oersteds are needed to apply detectable magnetism to acicular chromium dioxide at room temperature.

Alternatively the latent magnetic image can be created in the magnetic member by means of a magnetic write head. The magnetic write head can provide the requisite magnetic structuring in the latent magnetic image directly.

The magnetic member used in the Examples is a layer of acicular chromium dioxide particles in a binder coated on a polyester film which may, or may not be aluminum-backed or aluminized.

The thickness of the $CrO_2$ layer on the film is limited only by the ability of the layer to absorb sufficient thermal energy to effectively demagnetize the $CrO_2$ layer by raising a given thickness of the said layer above the Curie point of 118° C. during the thermal imaging process. Thicker layers are preferred to enhance magnetic field strength. Practically, the thickness of the $CrO_2$ layer on the imaging member is from 50 to 2000 microinches (1.27 to 50.8 micrometers), and is preferably from 150 to 500 microinches (3.81 to 12.7 micrometers).

The magnetic member can be used either mounted in the form of an endless belt supported by a plurality of rolls or mounted to the curved printing roll 11. The imaging and toning steps are separate entities which do not need to be done consecutively in predetermined sequential fashion. For instance, it may be desired to mount a preimaged magnetiic member on the printing roll.

The magnetic member can be imaged in a variety of ways, either held flat or attached to the curved printing roll. One form of the master image is a silver photographic image transparency of a printed circuit diagram. This is held in contact with a prestructured magnetic member and flashed with a Xenon flash tube. The energy transmitted through the transparent parts of the master raises the $CrO_2$ above its Curie temperature of 118° C. and demagnetizes it; the opaque parts of the design minimize energy transmission and the design remains as a latent image on the CrO$_2$ film if excessive flash energy is avoided. Alternative procedures are to scan the desired circuit designs onto the printing member having no prestructure with electromagnetic recording heads, or to selectively demagnetize prestructured areas of the magnetic member with point sources of radiation, e.g., lasers, which heat selected areas of the magnetic member to above the Curie temperature of the magnetic material in the magnetic member. These devices may be designed to respond in an on-off fashion to a computer-stored or computer-aided design.

Precise image registration is important when the process of the present invention is used to form both single-sided and double-sided circuit boards or to chemically mill double-sided patterns or shapes on metal.

Decoration and Transfer

Rotation of the drum past a toner reservoir decorates the latent magnetic image with a magnetic toner to form a toner image which consists of multiple layers of toner. By multiple layers of toner we mean that at least two layers of toner particles are applied to the latent magnetic image in the magnetic member on the surface of the drum. This is necessary so that sufficient toner is available in the transferred image to form a coalesced (hole-free) resist image on the substrate surface. Multiple layers of toner particles on the latent magnetic image are achieved by control of toner particle size so that excessively large particles are not present and by having sufficient field strength of the magnetic member and sufficient concentration of magnetizable material in the toner. A dry toner is preferred which consists of coalescible magnetic particles composed of magnetic and resin binder components. Background toner is removed from nonmagnetized background areas by means of a vacuum knife, air knife, or a combination vacuum knife and air knife.

A substrate which, unlike ordinary paper, is free of interstices, such as a circuit board composite blank of suitable material is uniformly preheated to a suitable temperature. The substrate not only has the capability of being uniformly preheated but has sufficient heat capacity to retain this uniformity of heating sufficiently to make the toner uniformly adhere to the substrate in the transfer step.

Rotation of the drum decorated with multiple layers of toner in rolling contact with the preheated blank using a pressure roll surprisingly effects simultaneous transfer and adhesion of virtually all of the multiple layers of the toner image to the interstice-free surface of the blank in an adhesive transfer step and this is accomplished without loss of image fidelity. The transferred image may be either a positive or a negative resist, depending upon the master design and provides high fidelity reproduction of this design. Post-transfer heating may improve the coalescence of the image if necessary.

An important feature of the decoration process and subsequent transfer are the properties of the toner used. Preferred toners of the present invention will be described in a later section of this specification. The simultaneous adhesion of the polymer component of the toner and transfer of the toner to the circuit board composite to form a resist without loss of image definition demands a narrow and specific set of process conditions for the successful transfer of a particular toner.

Imaging, decoration and transfer are separate operations which may be, but are not necessarily immediately consecutive reactions. In magnetic printing of circuit boards, the magnetic image of a particular design can ordinarily be preserved after preparation and used any number of times to prepare multiple copies of identical circuit boards, either in a single run or intermittently. More importantly, the distinguishing feature of the present invention is simultaneous tackifying of the toner particles and transfer to the circuit board with adhesion to form a cohered coating on the circuit board without free particles falling off the boards.

An important feature of this invention is that successful transfer and faithful reproduction of the desired image is accomplished without adhesion of softened toner to the magnetic member.

Adhesion of toner particles can be accomplished by a combination of heat and pressure. The simultaneous application of heat and pressure is the preferred method of adhesive transfer in this invention. An essential characteristic of the transfer process is that application of heat to the toner particles is from the circuit board which causes the toner to adhere to the circuit board, but not to the magnetic member while the transfer step is carried out. Under one set of preferred operating conditions the combination of heat and pressure causes the adhesive transfer to form thick pinhole-free resists. Under another set of preferred operating conditions, the toner is tackified sufficiently to adhere to the substrate but without complete coalescence of the toner particles and the adhered image of toner particles is further treated in a post-transfer stage such as by heating to achieve additional adhesion and coalescence.

Binder components of toners have a temperature region over which they tackify, i.e., soften and adhere to the substrate (circuit board) sufficiently to be pulled away from the gripping force of the latent magnetic image, but do not adhere to the magnetic member under the conditions of transfer. If the resin component becomes truly fluid, loss of image definition occurs by smearing of the transferred image and/or by a portion of the toner remaining adhered to the magnetic member. It is essential that the toner resin be solid before transfer, rapidly become tacky at the transfer nip because pressure at the nip is applied only for a moment (substantially instantaneous tack), and maintain image definition. For the toner of Example 1, the following chart shows the effect of different heating temperatures for the circuit board at constant pressure and speed for the toner transfer step.

| Transfer Temperature | Observations on Toner and Resist |
| --- | --- |
| 125° C. | less than 90% transferred to board, small % permanently adhered to CrO$_2$ image |
| 120° C. ↑ | more than 90% transferred to board; shiny (coalesced) image. |
| PREFERRED RANGE ↓ | more than 90% transferred to board; adhered but not fully coalesced. |
| 112° C. | more than 90% transferred to board; adhered very lightly. |
| 110° C. | less than 90% transferred to board; partly adhered. |
| 100° C. | no toner transferred to board. |

For this chart, the board temperatures of 120° to 112° C. represent the transfer "window", i.e. the temperature range at which the process is successfully carried out using the toner and transfer conditions of Example 1. From the results shown for temperatures above and below this window, it can be seen that the "window" is quite narrow insofar as temperature range is concerned.

Transfer by tackifying, or adhesive transfer, is subject to the important variables of temperature, printing (transfer) speed, stored heat and nip pressure. Adhesive transfer temperature is critical since this is a dynamic physical process. It is related to the physical properties of the toner resin. In general, the transfer temperature may be from about 40° C. to 150° C. depending on the melting point and melt viscosity of the resin binder and nip pressure. This is illustrated for specific cases in the examples which follow; these examples are non-limiting with respect to the transfer conditions. The lower operating limit is based solely on the necessity of having a non-tacky fluidizable toner at room temperature. Although a lower temperature might be operable, ambient storage temperatures might rise sufficiently to cause such toner to block or coalesce into large particles on standing. The upper limit is also related to the Curie temperature of the magnetic material in the magnetic member. In the case of $CrO_2$, the Curie temperature is about 118° C. but a transfer temperature somewhat above this value can be employed since the process is dynamic and the momentary heating of the magnetic member by the heated substrate at the pressure nip coupled with the insulating effect of the toner can effectively prevent the surface of the magnetic member from reaching the Curie temperature. Of course, when using magnetic materials having higher Curie temperatures, higher temperatures may be used.

Generally speaking, the shorter the contact time, the higher the temperature that should be used. Conversely, increasing contact time by decreasing printing speed can result in lowering the transfer temperature. Depending on the temperature range, the printing speed generally is more than 1 ft/min (0.5 cm/sec) preferably from 5 to 150 ft/min (2.54 to 76.20 cm/sec) and more preferably from 10 to 120 ft/min (5.08 to 60.96 cm/sec).

Contact pressure may vary considerably. Generally when using a roll, a pressure of from 5–100 pounds per linear inch (pli) (0.89–17.8 kg/cm) will be used. Higher pressures may be used but transfer pressure is eventually limited by the danger of embossing of the magnetic member. Pressure serves to ensure firm contact and to enhance consolidation of the coalescing toner. The multiple layers of toner particles necessary for this consolidation and coalescence to a resist image presents the problem of achieving this result without also losing image fidelity.

The time of application of pressure to transfer the toner to the substrate should be momentary in order to achieve the highest fidelity resist image. Preferably, this time is no greater than one second and more preferably no greater than 0.1 second.

A key feature for the successful operation of the printing machine is the existence of a temperature differential between the surface of the circuit board and the magnetic member since the temperature of the surface of the magnetic member should not reach the point at which the toner will tackify and stick to the magnetic member. The precise temperature, of course, is related to the toner resin itself and the operating conditions. Some resistance to sticking can be obtained by optional application of release agents such as "Slipspray Dry Lubricant" (Du Pont) or "RTV" Silicone rubber (GE) to the surface of the magnetic member without destroying the ability of the latent magnetic image to pick up toner particles.

The present invention provides a sharp, well defined thick layer of toner in the form of a coalesced resist image on the heated substrate surface receiving the toner from the magnetic imaging member. The success of the present invention is surprising for several reasons, among them being the following. First, the surface of the substrate, e.g. metal or plastic, is smooth relative to the surface of paper, i.e., no interstices are present, and the toner adheres sufficiently to the surface to withstand subsequent modification of the surface such as by etching. Second, the resist image is a high fidelity reproduction of the original or desired image despite having been formed under heat and pressure from multiple layers of toner on the latent image of the magnetic member. Third, all of the multiple layers of toner, as required to avoid discontinuities in the resist image, are transferred to the substrate upon only momentary application of pressure on toner particles just then being subjected to heat by the substrate. Fourth, the image of toner particles can be transferred from the magnetic member directly to the substrate surface, e.g., printed circuit board, on which the image is to serve as a resist.

The resist image formed of coalesced toner protects the underlying areas of the substrate surface according to the master design. The unprotected areas are then modified, preferably permanently, by such processes as etching, electroplating or electrolessly plating. In the print and etch mode of manufacture, the unprotected areas are etched away and the resist image is subsequently stripped to expose the underlying metal, e.g. printed circuitry, if desired.

In another embodiment of the present invention, the circuit board substrate onto which the magnetically held image is transferred is capable of being selectively plated with electrically conducting material. The resist image must be thick enough to minimize pinhole formation and preferably should be thick enough to provide channels deep enough to contain the thickness of the plating. Significant overplating (mushroom effect) of plated metal beyond the circuit lines onto the resist image is generally prevented when a 0.4 mil (0.0102 mm) or more thickness of resist is present.

Either a negative or a positive image may be printed onto a circuit board composite for subsequent conventional circuit board preparation. A positive resist image is defined as one which leaves the circuit lines exposed. The product may be subsequently treated by optionally plating the exposed lines with copper and then plating with a material such as solder which is resistant to etchants such as ferric chloride. The resist may be removed and the newly exposed substrate removed by etchants to form the printed circuit. Copper is conveniently etched with ferric chloride.

Ferric chloride or other etchants may be used for chemical milling; this is a deep etching method which avoids the stresses of mechanical milling. If a negative resist image is defined as one which covers the circuit lines with resist, the treatment consists of etching or chemically removing the exposed substrate and, if desired, removing the resist image, and if desired thickening the exposed circuit lines by plating may subsequently be done.

Product

The above process forms a printed circuit board, which is an electrical circuit in the form of a network of metallic conductors on an insulating background of suitable dimensions.

The conductive layer may be mounted on inert non-conductive base materials and the toner resist defining the circuit lines printed magnetically on one side only, or a circuit board having a conductive layer on both sides may be printed with complimentary designs which require accurate registration of the toner resist on both sides. In both cases, undesired material in the conductive layer may be removed by etching.

Chemical milling by etching is an alternative process to mechanically milling a desired pattern since mechanical milling tends to leave strains in the metal.

Suitable materials, including alloys, for magnetic printing substrates are the structural metals which include but are not limited to copper, silver, aluminum, stainless steel, magnesium, duraluminum, tin, lead, nickel, chromium, iron-nickel-cobalt alloys such as "Kovar" and "Alloy 42", and beryllium copper, which may or may not be supported on a suitable electrically insulating base material, depending upon the desired application of the end product. Chemically milled samples are unsupported, whereas printed circuit boards are usually used in supported form. Providing a support allows the use of a thinner layer of electrically conducting material.

Copper is the preferred metal for the electrically conducting material for printed circuit boards because of its good thermal and electrical conductivity in relation to cost. Iron-nickel-cobalt alloys such as "Kovar" and "Alloy 42", beryllium copper, duraluminum, aluminum and stainless steel are preferred substrates for chemical milling applications.

For circuit boards in which a metal layer is laminated to an insulating base, suitable insulating base materials include vulcanized fiber, mica, glass, asbestos, cotton, glass fiber, polyester, aromatic polyamide, cellulose, aromatic polyimide and mixtures of these with one another, preferably bonded into a laminate with a thermosetting phenolic resin or an epoxy resin or mixtures thereof.

Advantages of Magnetic Printing Over Other Methods of Preparing Printed Circuit Boards (1) Magnetic printing provides a better quality resist on metallic substrates than is possible with electrophotographic printing. This is because all of the toner in the electrophotographic process has the same electrical charge (either positive or negative) which causes the toner particles to tend to repel each other even though they are attracted to the metallic substrate. This has a tendency to cause pinholes which is a particularly serious problem when plating on the metallic substrate to form a printed circuit board. Magnetic printing can be used to print directly and repetitively on metallic substrates with sharp-edged definition. Electrophotographic systems also require constant reforming of the latent electrostatic image after transfer to the substrate. The electrophotographic process, therefore, is time-consuming and the product circuit boards are typically of low quality.

(2) Magnetic printing does not suffer from the distortion of image dimensions observed with screen printing. In screen printing, the design is prepared on screens of stainless steel wire, nylon, polyester or metallized polyester fibers held in a steel frame. Repetitive off-contact printing with these screens causes screen distortion with every pass of the squeegee. Eventually, the registration of the design is lost and the screen must be prepared again. This is costly in terms of time and materials, particularly since screen preparation is time-consuming.

(3) Magnetic printing overcomes the disadvantage of offset lithography, namely, thin coatings full of pinholes which require more than one pass. Offset lithography also requires a careful balance to be maintained between the emulsified ink resist and water and drying of the printed resist image which could entrap dust during drying.

(4) Thick, well defined (sharp break between resist and substrate surface), dense, uniform coatings of resist of up to 2.0 mils (0.0508 mm) and preferably 0.3 to 0.8 mil (0.0076 to 0.0203 mm) can be deposited by magnetic printing. This thickness is sufficient to avoid pinholing and prevent conductor spreading by most overplating.

(5) Simultaneous transfer and adhesion without significant loss of definition of the transferred image provide a distinct advantage over the magnetic resist-forming process as disclosed in U.S. Pat. No. 3,650,860.

The process of the present invention has the capability of preparing printed circuit boards having both conductor area uniformity and conductor line edge quality much superior to those previously prepared by direct printing using fusible dust or adhesive and metal dust or electrostatic or xerographic printing. The process of the present invention also has the capability of preparing printed circuit boards having conductor line edge quality superior to those previously prepared by screening, in that the conductor lines do not have undesired "necks" in them as often occurs in screening. Offset printing is capable of printing sharp lines but cannot produce the pinhole-free resist needed for etching or plating.

The process of this invention can also be used to prepare printing plates for both planographic and relief printing. The use of an oleophilic toner transferred to a hydrophilic support, e.g., aluminum lithographic printing plate, will produce directly a lithographic plate which will accept ink in the toned areas. Alternatively, the use of a hydrophilic toner applied to a hydrophobic plastic or metallic, e.g., copper, support, will provide a lithographic plate which will accept ink in the areas free of toner. A wide variety of plate making procedures may be employed by depending on the use of the coalesced toner image as a resist. For example, a hydrophobic coalesced toner image may be used for the manufacture of deep etch as well as bimetallic and trimetallic planographic plates. Further, coalesced toner images can be used in all the conventional methods of preparing letterpress plates by photoengraving, e.g., etching zinc, copper, or magnesium with powdering or powderless etching methods, and duplicates can be made in the form of stereotypes, electrotypes, plastic, or rubber plates. In addition, coalesced toner images made by the process can be used to prepare gravure printing plates with wells of variable area and constant depth.

SPECIFIC EMBODIMENTS OF THE INVENTION

The following illustrative examples demonstrate ways of carrying out the invention. The invention is not restrictive or limited to these specific examples. All parts and percentages are by weight, and all temperatures are Centigrade, unless otherwise noted.

EXAMPLE 1

This example embodies a preferred method for printing resists on copper circuit board blanks. The steps in preparing the resist are (1) mounting a pre-imaged magnetically active film on the print roll and rotating it past the corona unit, (2) toning the imaged film with a finely divided magnetic toner, (3) passing the toned image near an AC corona discharge device to reduce static electricity, (4) passing the toned image under a combination air knife/vacuum knife to remove background toner from the demagnetized areas of the imaged magnetic film, and (5) contacting the toned image momentarily with a preheated circuit board blank to tackify, transfer and adhere the toner to the copper surface simultaneously.

The steps described above were carried out on the printing machine described hereinbefore with reference to FIGS. 1 and 2.

The toner consisted of 50 parts by weight "Atlac"382ES polyester resin purchasable from ICI, Ltd., (a propoxylated bisphenol-A, fumaric acid polyester having a tack point of 70° C. and a liquid point of 100° C.), molecular weight of 2500–3000 and Tg of 58° C., and 50 parts by weight magnetic iron oxide, MO 7029, (Pfizer) having an average particle size of 0.5 $\mu$m. Tack point and liquid point are manufacturer's tests involving temperature at which resin particles will stick to a heated bar and the temperature measured in a melting point tube, respectively. The average particle size of this toner was 8.5 $\mu$m. The toner was placed in the toner applicator, 18. The applicator, 18, was activated and moved close to the printing roll so that fluidized toner contacted printing roll, 11. The printing roll drive was activated to move the pre-imaged magnetic film 15 through the standing wave of toner and cause magnetic toner to adhere to the magnetic parts of the image. The toned film was then rotated past the corona discharge, 19, and the combination air knife/vacuum knife, 20. The knife, 20, was placed approximately 35 mils (0.89 mm) from the film surface. The air pressure was 3.8 inches (9.65 cm) of water and the vacuum was 0.30 inch (0.76 cm of water).

To effect transfer of the toned image, the film was rotated into position. The circuit board blank, 21, preheated to 116° C. by hot plates 22 and 23 was pushed into the nip, 17, and contacted with the toned image rotating through the nip at a speed of 26 linear feet per minute (13.2 cm/sec) and a pressure of 40 pounds per linear inch (7.15 kg/cm). The circuit board with the printed resist was deposited beyond the nip and no toner was detectable by rubbing with the fingers on the latent magnetic image.

Examination of the printed resist by microscope showed few residual unwanted particles in the circuit lines and very few pinholes in the resist which showed that the melted resist had had good melt cohesion. Several circuit boards were prepared in this manner. Some were post-print heated for 2 minutes in an oven at 125° C. to cause additional consolidation of the resist. The thickness of the resist was measured and found to be 0.6 mil (0.015 mm). Boards of both types were subsequently processed by standard circuit board electroplating methods, consisting of the steps of preplating cleaning, electroplating in copper salt baths, additional plating in lead/tin protective plating baths, stripping the resist from the circuit board in methylene chloride, and etching the exposed copper to leave circuit lines. Good circuit boards were obtained. This means that the boards reproduced the original image and acceptable boards were formed. Reproducibility was demonstrated.

This example illustrates the use of all essential parts of the magnetic printing apparatus.

EXAMPLE 2 a. The process of Example 1 was repeated using another toner prepared from 50 parts of "Atlac" 580 resin, purchasable from ICI, Ltd., having a molecular weight of 1450 and Tg of 43° C., and 50 parts of magnetic iron oxide. "Atlac" 580 is a bisphenol-A, fumaric acid polyester with terminal vinyl groups modified by inclusion of a urethane moiety. The average particle size of this toner was 9.9 $\mu$m. Very good resists with few pinholes and low background were obtained. The thickness of the resist was measured and found to be 0.8 mil (0.02 mm).

b. Ten g of a toner prepared from 50 parts "Atlac" 580 resin, available from ICI, Ltd., and 50 parts magnetic iron oxide were mixed in 500 cc of water containing 2 g of "Fluorad" FC128 wetting agent available from the 3M Co. The mixture was used to tone a 47.2 lines/cm halftone image on a $CrO_2$ layer on Mylar ®.

The toned magnetic image was rinsed in 2 g "Fluorad" FC128 in 500 cc of water and dried.

The toned image was mounted on the printing roll of the apparatus described in Example 1.

To effect transfer of the toned image, a 305 $\mu$m sheet of anodized aluminum lithoplate base was preheated to 120° C. by hot plates and was pushed into nip 17 and contacted with the toned image rotating through the nip at a speed of 55 linear feet per minute (28 cm/sec) and a pressure of 40 pounds per linear inch (7.15 Kg/cm).

This gave an excellent transfer of the toner image to the lithoplate base.

EXAMPLE 3

In this example a toner was prepared consisting of 45 parts by weight "Atlac" 382ES, 5 parts triphenyl phosphate and 50 parts magnetic iron oxide of the type used in Example 1. The average particle size of this toner was 19 $\mu$m and it had a melt index of 26 and Tg of 30° C. This toner was applied to the $CrO_2$ magnetic film and transferred to a circuit board blank as also described in Example 1. In this case, the board temperature was approximately 85° C.; the transfer rate through the nip, 39 linear feet per minute (19.8 cm/sec); and the nip pressure, 40 pounds per linear inch (7.15 kg/cm). Under these conditions, the toner transferred to the circuit board but was incompletely coalesced so that individual toner particles and numbers of tiny pinholes could be seen by microscope. When the board was subsequently briefly post heated to 120° C., the toner particles coalesced fully and the previously observed pinholes had disappeared. The thickness of the resist was measured and found to be 0.7 mil (0.018 mm). Post heating can be omitted at a higher board temperature at the transfer step, such as 105° C.

The board was cleaned briefly in a sulfuric acid/ammonium persulfate bath and plated in a copper sulfate bath. Good copper deposition occurred on the circuit lines but virtually no plating nodules typical of deposition at pinholes could be found.

EXAMPLE 4

This example illustrates wet toning and transfer with a hand roll. Imaged $CrO_2$ film was toned by agitation in a slurry of the toner in an Igepal CO710 (nonionic surfactant, General Dyestuffs Corp.) solution. The toner composition was a 50:25:25 mixture of low molecular weight polystyrene (Hercules XPS 276) having a Tg of 48° C., magnetic iron oxide (Columbia, "Mapico Black") and carbonyl iron GS-6 (GAF Co.) having an average particle size of 5 μm. The average particle size of the toner was about 18 μm and the range of toner particle size was about 8–25 μm. Surplus toner was rinsed from the film with clean wash water containing "Igepal". The film was dried and mounted on the thermal transfer machine. Circuit board blanks were printed by a hand-operated roll, similar to the one shown in FIG. 1 but without automatic drive and pressure control device (pressure estimated as 0.36–1.8 kg/cm), at a circuit board temperature of 114° C. and a roll transfer speed of 1 inch/sec (2.54 cm/sec). Clean transfer of the toner to the board was observed. The measured thickness of this resist was from 0.35 to 0.60 mil (0.009 to 0.015 mm). The bare surfaces of the circuit board blank can be etched or plated.

EXAMPLE 5

A 5-mil (0.127 mm) aluminized Mylar ® polyester film with a topcoat of 0.16 mil (0.00406 mm) of $CrO_2$ was prestructured magnetically with a 197 cycles/cm signal. The film was thermally imaged using a 65 line per inch (25.6 line per cm) halftone image with a xenon flash lamp operating at 2200 volts and 240 microfarads. After exposure the imaged film was dipped for 15 sec in a toner mixture composed of 7 g of a polystyrene toner (50% by wt. polystyrene, 25% by wt. $Fe_3O_4$ and 25% by wt. carbonyl iron) and 2 g of a dispersing agent in 400 g of water. The toned film was then rinsed in a dispersion of 1 g of dispersing agent in 500 cc of water.

The toned image was transferred by placing the toned $CrO_2$ film in contact with an anodized aluminum surface using a Mylar ® cover sheet in a vacuum frame at 28" mercury (71 cm Hg) vacuum to obtain intimate contact. The surface of the Mylar ® cover sheet was heated to various temperatures depending on the toner and melt-transferred to the aluminum surface. The printing quality obtained using a vacuum frame was not as good as when the transfer step involved momentary application of pressure such as by using the apparatus of FIGS. 1 and 2.

In this manner, a polyamide/Fe/$Fe_3O_4$ toner was transferred at 150° C., another polyamide (45%)/Fe(27%)/$Fe_3O_4$(27%)/1% C. toner was transferred at 120° C., an epoxy (40%)/$Fe_3O_4$(29%)/Fe(30%)/1% C toner was transferred at 110° C., a poly(styrene)/$Fe_3O_4$ toner was transferred at 110° C. and a poly(styrene/acrylate) (50%)/$Fe_3O_4$ (50%) toner was transferred at 150° C. Following transfer, the plates were post heated to 200° C. for about 5 sec.

Lithoplates prepared as above were made using the epoxy/$Fe_3O_4$ and polyamide/Fe/$Fe_3O_4$ toners. The plate was then coated with a hydrophilic printing gum. The plate was then placed on a multilith press, and using a multilith offset ink, a total of 50,000 copies were run off with no wear of the image noted.

By a manner indicated in preceding experimental sections, a deep etch lithographic printing plate can be prepared by subsequently removing adjacent areas of metal from the resist-printed plate.

Similarly, by transferring the resist to a copper gravure cylinder and etching the remaining exposed surface, a gravure printing surface can be produced.

A letter press printing plate can be produced on metal or plastic by making a resist on the surface of the plate as described above and subsequently etching or dissolving adjacent metal or plastic surfaces.

Resist Compositions of the Present Invention

The process of the present invention places an unusual set of requirements on the magnetic toner. The toner has to have a substantial proportion of magnetic material in the particles so as to be attracted to the latent magnetic image in the magnetic member in order to decorate it with the desired image of toner particles. The particles of coalescible resin in which particles of this magnetic material are embedded must form the coalesced resist image adherent to the heated surface. The magnetic material detracts from the flowability and coalescibility of the particles into the resist image and the coalescible resin detracts from the ability of the toner particles to decorate the latent magnetic image with fidelity.

The toner particles also have to transfer from the magnetic member to the heated surface in the brief moment of application of pressure of the heated surface and the toner particles against each other. In other words, the adhesion of the particles to the heated smooth surface has to be practically instantaneous, without exceeding the Curie temperature of the magnetic member or causing particles to adhere to it. The coalescence of the particles on the surface has to be complete, or made complete later if necessary, because of the resist image utility which cannot tolerate holes, e.g., pin holes, in the resist image which would lead to undesirable etching or plating of the surface. In addition, the instant adhesion of the particles to the surface has to be sufficient to obtain release of the particles from the latent magnetic image in the magnetic member, and sufficient adhesion to the surface has to be obtained for the resist image to withstand such subsequent modifications of the surface as etching or plating of the surface.

The prior art does not disclose toner compositions to be able to meet the requirements set forth above. U.S. Pat. No. 3,650,860 discloses a toner composition of ferromagnetic materials dispersed in an etch-resistant binder such as polyvinyl chloride. The toner is not used for image development in the dry state, but instead, is added to solvent for the binder and flowed onto a magnetized surface to adhere only to the magnetized portion thereof. Upon drying, the resultant film acts as an etching resist. U.S. Pat. No. 4,099,186 discloses a ferromagnetic toner for printing onto textiles, in which the toner composition comprises a ferromagnetic component, a dye and/or chemical treating agent, and a water-soluble or water solubilizable, preferably thermoplastic, resin which encapsulates the other components. U.S. Pat. No. 3,681,106 discloses electrostatic compositions for electrostatic image reproduction, comprising pigment and a specific class of polyester resin binders. Additives to the composition, such as dye, plasticizers and resin fillers are disclosed to improve the handling properties of the toner or adapt the toner for a particular electrostatic printing process. The patent also discloses the composition to have both electrostatic and magnetic properties by using up to 50% by weight of magnetic powdered pigment, such as iron oxide or similar materials, as the pigment.

As mentioned hereinbefore, the dry particulate resist compositions of the present invention comprise three essential ingredients, thermoplastic resin binder, plasticizer for the resin present as part of the binder and magnetic material present in the binder. Each of these ingredients has preferred characteristics and their combination produces a composition having unexpected temperature sensitivity and other preferred characteristics as will be described hereinafter.

The plasticizer reduces the temperature at which the magnetic particles will tack transfer. "Tack transfer" temperature is the preheated substrate surface temperature at which at least 90% by wt. of the particles will adhere to the substrate surface under a pressure of about 40 pli (7.15 kg/cm) without coalescence of the particles to an impervious image which is a resist image. This temperature is determined using the rolls 11 and 12 of FIG. 1 at a speed of 25 cm/sec, in which the neoprene backing sheet is 0.6 cm thick and has a durometer of 50 and the composite 21 is 0.08 cm thick and has copper cladding (on an insulating base) on the surface being imaged. At this temperature, essentially no particles adhere to the magnetic member by virtue of tackiness or melting of the particles. The image at tack transfer consists of particles agglomerated together, whereby the original particles prior to transfer have lost some of their identity, but are not entirely coalesced. The agglomerated particles are bound together and adhered to the substrate surface so that loose "original" particles are not present.

Surprisingly, the reduction in tack transfer temperature through plasticization widens the temperature window at which the transfer of toner from the magnetic member to the heated substrate surface, whether by tack transfer or tack transfer and simultaneous coalescence, can be carried out. To illustrate, the chart contained earlier in this specification shows a temperature of from 112° to 120° C. for a particular toner in which the binder is thermoplastic resin only. A small amount of plasticizer, e.g., 5% based on total weight of the composition can lower the tack transfer temperature to as low as about 65° C. for the same resin and at the same time enables the transfer to be carried out at temperatures as high as 110° C., without the toner particles sticking to the magnetic member. Thus, the transfer window for the plasticized toner is about 45° C. instead of 8° C. for the unplasticized toner. This has the advantage that some latitude is available in the process which enables it to have commercial utility. Also, less heating is required, thus lowering cost.

The widening of the transfer window provided by resist compositions of this invention also enables the process to be conducted in two steps. The first step is to heat the substrate surface sufficiently so that the composition will tack transfer to it. The second step is to heat the tack-transferred image further at another location in order to coalesce the image to a resist image on the surface. The advantage of this is that it minimizes the amount of preheating of the substrate in order to get the toner particles to transfer to it. It is desirable to minimize preheating of the substrate so as to minimize its thermal expansion which detracts from registration of the board with the image. Also, infrared heating is the most economical preheat method and it is difficult to preheat the shiny (copper) surface of the substrate by radiant heat. As for post heating to coalesce the transferred image, the transferred image is a "black-body" which is of smaller area and absorbs radiant heat more efficiently than the substrate surface. Thus, relatively little post heating such as by radiant heating is required to coalesce the image.

The resist composition of the present invention is "dry" in the sense that it is powdery and does not appear to have any liquid present.

The thermoplastic resin together with the plasticizer for the binder component of the composition of the present invention provides a substantially non-blocking composition at ordinary room temperature (20° C.) and adhesion to the metal surface to which the composition is transferred under heat and pressure. The binder is selected so as to be adherent to the particular substrate under transfer conditions. The binder also supplies strength to the resist image so that it does not smear and can withstand reasonable handling and is not displaced by the usual treatments, e.g., spray of aqueous $FeCl_3$ involved in etching. In the case of plating, the binder also withstands the chemical action of the plating bath so that the resist image can function as such.

The thermoplastic resin is selected with these criteria in mind. Preferably, the resin is water insoluble at ordinary room temperature so as to be able to withstand aqueous treatments such as etching or plating, although solubility in aqueous alkali solution, e.g., 2% KOH, may be desired. Preferably, the resin has a weight average molecular weight of at least 1000 and less than 50,000, and more preferably, less than 25,000. Typically, resins used for xerographic toners have a higher molecular weight in order to avoid fracturing during triboelectric charging which involves tumbling of toner particles with carrier beads. Such higher molecular weights should not be used in compositions of this invention because they decrease the speed at which the resin becomes tacky, thereby detracting from instant adhesion at the time of tack transfer. Most preferably, the thermoplastic resin has a molecular weight at which the resin has Newtonian viscosity character, i.e., flow property increases substantially linearly with increasing shear, or which can be made to have Newtonian viscosity character upon the addition of plasticizer to form the binder component.

Examples of polymers meeting these criteria are as follows: acrylic polymer in which at least 40% of the polymer is derived from one or more acrylic units, e.g., acrylic acid, methacrylic acid, and esters and nitriles thereof, such as polymethylmethacrylate and copolymers and terpolymers thereof with $C_1$–$C_8$ alkyl acrylates, $C_2$–$C_8$ alkyl methacrylates, styrene, and acrylonitrile; styrene copolymers such as with maleic anhydride, acrylonitrile or butadiene; polyvinylacetate; polyesters, especially those prepared by reaction of a dicarboxylic acid with a polyhydroxy compound such as described in U.S. Pat. No. 3,681,106, examples of such acid being as follows: aromatic acids and aliphatic acids, saturated or unsaturated, such as maleic acid, fumaric acid, glutaric acid, terephthalic acid, and polyhydroxy compounds such as bisphenol A and alkylene diols; cellulose esters such as cellulose acetate butyrate; and polyamides such as those formed from diacid chlorides and diamines, e.g., hexamethylene-1,6-diamine and sebacyl chloride, the N-alkylated polyamides and polyamides described in U.S. Pat. No. 3,778,394.

Particulate compositions of the present invention which are to be soluble or at least swollen by aqueous alkali solution, e.g., in order to be strippable from the substrate surface after having served as a resist, face the additional problem that they tend to be hygroscopic, which leads to blocking of the particles at ordinary room temperature. As part of the present invention, it has been discovered that acrylic and styrene copolymers such as described above, which have an acid number of at least 25, and preferably at least 50, and molecular weight low enough to provide transfer, will not be excessively hygroscopic in compositions of the present invention. In order to avoid excessive sensitivity to humidity, the acid content should not be too high. Thus, an acid number for the polymer of no greater than 125 is preferred and no greater than 100 is even more preferred.

Selection of the plasticizer component will generally depend on the particular thermoplastic resin used so as to be compatible therewith, i.e., not form a separate phase. Preferably, the plasticizer has a boiling point above 200° C. and does not detract from the adhesion capability of the thermoplastic resin for the particular substrate intended and has a lower molecular weight than the thermoplastic resin with which it is used. Examples of plasticizers are the aromatic phosphates such as triphenylphosphate and the phthalates such as dioctyl phthalate, the adipates such as dioctyl adipate, the sulfonamides such as toluene sulfonamide, the polymeric plasticizers such as low molecular weight acrylic resins such as ethyl acrylate/methyl methacrylate/acrylic acid copolymer ("Carboset" 515) and ethylene/vinyl acetate copolymer.

The amount of plasticizer is selected to lower the temperature and broaden the temperature range preferably to a range of at least 20° C. at which the particulate composition will transfer from the magnetic member to the heated surface substantially instantaneously, with image fidelity whether by tack transfer alone or tack transfer and simultaneous coalescence to produce a tough coalesced resist image on the heated surface. This effect is to be accomplished without causing the particulate composition to block at ordinary room temperature. The plasticizer also reduces the brittleness of the thermoplastic resin, thereby increasing the toughness of the resist image. While lowering the tack transfer temperature of the composition, however, the plasticizer should not make the resist image deformably soft. Generally, no more than 40% based on the weight of the binder is necessary, and as little as 2% by wt. can give significant beneficial effect, depending on the thermoplastic resin and plasticizer involved. Preferably, the amount of plasticizer will be from 5 to 15% based on the weight of the binder.

The magnetic material component of the composition is readily magnetizable, and preferably has a coercivity of less than 400 oersteds. To be useful in electroplating, the magnetic material is preferably a dielectric material as well. Preferably, the magnetic material is substantially non-porous and substantially isometric so as to minimize its surface area to be substantially encapsulated by binder. By "substantially non-porous" is meant that the particles of magnetic material are solid instead of fibrous or porous and by "substantially isometric" is meant that the particles are fairly uniform in shape with all dimensions of each particle being within about a factor of three of each other. Examples of magnetic materials are as follows: $Fe_3O_4$, $Fe$, $CrO_2$, and ferrites.

The magnetic material preferably has an average particle size of less than 6 $\mu$m and moe preferably from 0.1 to 1 $\mu$m. "Average particle size" disclosed herein can be measured optically by measuring each particle of a sample using an electron microscope or for the larger size toner particles, a Coulter counter can conveniently be used for particle size measurement.

The proportion of magnetic material in the composition is from 40 to 80% by wt. and the binder component from 20 to 60% by wt. to total 100% of the total weight of these components in the composition. A smaller proportion detracts from the ability of the particles of composition to be attracted sufficiently to the latent image in the magnetic member. A larger proportion detracts from the coalescence and adhesion of the resist image formed from the composition. Preferably, the proportion of magnetic material is from 45 to 65% based on the combined weight of the magnetic material and binder component.

The resist compositions of the present invention preferably have a melt index of from 1 to 100, as measured at 125° C. and 325 g load according to ASTM procedure D1238-73. Above 100, the resist image is too brittle for most applications and below 1, the toner does not have sufficiently quick response to become tacky at the instant the composition is brought into contact with the heated substrate surface under pressure. Preferably, the composition has a melt index of from 1 to 50 and more preferably from 4 to 40 so that the composition will have "quick tack", and the resist image will be tough and coalescible.

The presence of the large amount of magnetic material in the composition affects the melt index. For example, a thermoplastic resin having a melt index of 25 has its melt index increased to 56 when 10% by wt. of plasticizer based on the total amount of resin is mixed with it, but when an equal weight of magnetic material, based on the weight of resin plus plasticizer then is added, the melt index of the resultant composition is 20.

The resist composition (binder component) preferably has a glass transition temperature (Tg) of no greater than 110° C., and more preferably no greater than 80° C., obtained by the plasticizer lowering the original Tg of the thermoplastic resin. These low glass transition temperatures permit the composition to have tack and flow and desired transfer temperatures. The glass transition temperature of the composition should be greater than 25° C. and preferably greater than 40° C. to insure that the particles of the composition do not block during storage and normal handling.

The composition of the present invention can be made by melt blending the thermoplastic resin, plasticizer, and magnetic material, which disperses the magnetic material in the binder, cooling the blend and chopping it into chips in the Abbey Cutter or Micropulverizer (U.S. Filter Corp.) to pass a 20 mesh screen. The chips can then be passed through a micronizer (Sturdevant) to get the desired particle size. The magnetic material is present in the particle as a dispersed phase in a binder matrix.

The resist composition is also resistant to the particular modification to be practiced on the uncovered substrate surface. Preferably, the composition is at least resistant to aqueous $FeCl_3$ etchant.

Preferably, the particles of the composition of this invention have an average particle size of up to 30 $\mu$m, usually at least 1 $\mu$m, and more preferably in the range of 5 to 30 $\mu$m. Greater than 30 $\mu$m detracts from the coalescibility of the particles. Despite the presence of the large proportion of magnetic material in particles of the composition, sufficient binder is present at the surface of each particle to obtain the desired coalescence and adhesion.

The particulate compositions of the present invention have a high transfer efficiency at a transfer temperature in the range of 50°–120° C. and tack transfer temperature in the range of 50°–110° C. Generally, at least 90% of the particulate composition will transfer from the magnetic member containing the latent image by tack transfer alone or simultaneous with coalescence to the heated substrate surface on which the composition is to serve as a resist.

Example 3 is a composition of the present invention. Further examples (6–8 and 10–14) of particulate resist compositions of the present invention are as follows:

EXAMPLE 6

A toner was prepared in the following manner. Forty-five parts by weight of a low molecular weight polyester resin (Atlac ® 382ES, purchasable from ICI) was blended with 5 parts triphenyl phosphate in a 70/30 (by weight) mixture of acetone and toluene and 50 parts by weight $Fe_3O_4$ having an average particle size of 0.5 μm was added to it. The mixture was placed in a ball mill and milled 20 hours after which it was diluted with additional solvent and spray dried into a drying tower to form a particulate resist composition, having a melt index of 26 and Tg of 30° C., that was collected at the bottom of the chamber. The resulting powder was treated with 0.25 parts per hundred by weight with Tullanox ® 500 silica purchased from Tulco, Inc. The toner has an average particle size of 19 microns and was a free flowing powder.

The toner powder was placed in the toning box of the printing apparatus of FIGS. 1 and 2 and used according to that process to prepare printed resists on copper circuit board substrates. The temperature required to transfer the toner satisfactorily was determined by making successive trials at increasing temperature settings. Two temperatures were determined—the value at which essentially complete tack transfer was achieved and the value for full melt coalescence transfer. The tack transfer was about 85° C. and the melt transfer about 105° C. In contrast, the melt transfer temperature for a toner made from unplasticized Atlac ® 382ES is about 120° C. The resist thickness of a resist of the plasticized toner transferred at 95° C. was determined to be 0.7 mil. One of the resists that was tack transferred at 85° C. was reheated at 120° C. to achieve full coalescence. The board was electroplated in an acid copper sulfate bath for an hour after being cleaned in an acid ammonium persulfate solution. The resist remained intact throughout this treatment and had essentially no copper nodules indicative of pinholes.

EXAMPLE 7

A toner sample was prepared by the same procedure as in Example 6 except that the parts by weight of Atlac ® 382ES and triphenyl phosphate were 42.5 and 7.5 respectively and the solvent was acetone alone to reduce the heating temperature required to blow the solvent from the toner particles in the drying chamber. The resulting toner was subsequently treated with 0.25 part/hundred of toner with Tullanox ® 500 as in Example 1 to yield a good, free flowing powder. Average particle size was measured as about 14.5 micrometers.

The toning and printing characteristics of this toner were determined as in Example 6. Greater than 90% tack transfer occurred at 70° C. and melt transfer at about 95° C. This result is about 25° C. lower than that for pure Atlac ® and 10° C. lower than that of the toner of Example 6.

EXAMPLE 8

A toner based on Atlac ® 382ES resin was prepared in the same manner as in Example 6 but the plasticizer was dioctyl phthalate. The composition was 46 parts resin, 4 parts dioctyl phthalate and 50 parts $Fe_3O_4$ and had a melt index of about 28 and Tg of about 33° C. This toner was applied to the magnetic master film by the wet slurry procedure of Example 4 and test printed as described in the previous examples. Good tack transfer was achieved at 105°–110° C. in agreement with the results obtained with triphenyl phosphate. The transfer temperature was slightly higher because of the lower plasticizer concentration. A printed resist was subjected to the same plating procedure as in Example 6. The resist retained its excellent adhesion, permitting plating to occur only on the exposed circuit lines.

EXAMPLE 9 (Control)

A toner was formed by the procedure of Example 7 using cellulose acetate butyrate, type 551-02, having a molecular weight of 25,000 and Tg of 101° C., purchasable from Eastman Kodak. The composition was 50 parts resin and 50 parts $Fe_3O_4$. This toner was used in the manner of Example 8 and test printing was undertaken at successively higher temperatures, but even at 135° C. only a portion of the toner transferred to the circuit board and this material was dusty and had little or no tack. Temperatures above 135° C. are higher than desired for economy reasons and also present a risk of demagnetizing the latent magnetic image if $CrO_2$ magnetic film is used. Some higher board temperature can be used since the toner acts as a slight thermal shield and will prevent overheating of the film if the contact time is momentary and the temperature differential is low. Thus, toners with resins such as unmodified cellulose acetate butyrate which have high softening points are difficult to print into satisfactory resists.

EXAMPLE 10

A cellulose acetate butyrate-based toner was formed as in Example 7 using dioctyl phthalate plasticizer to have a Tg of about 70° C. and melt index increased to be greater than 1. The proportions were 43 parts cellulose butyrate, grade 551-02, 7 parts dioctyl phthalate and 50 parts $Fe_3O_4$. Printing tests showed good tack transfer at 100°–105° C. and melt transfer at 120°–127° C. Thus, transfer temperatures were greatly reduced from those of Example 9 in which no useful printing was obtained with unplasticized toner. One of the boards tack-transferred at 115° C. was postprint consolidated by reheating and both it and a board melt transfer-printed at 125° C. were plated as in Example 1. Both boards showed excellent resistance to plating baths and very few copper nodules.

EXAMPLE 11

A toner similar to that of Example 10 was prepared with triphenyl phosphate as plasticizer to have a Tg and melt index similar to that of Example 10. The formulation was 42 parts cellulose acetate butyrate, type 551-02, 8 parts triphenyl phosphate and 50 parts $Fe_3O_4$. This toner was test printed after toning the $CrO_2$ film by the wet slurry procedure as previously described. Excellent tack transfer occurred at 110° C. and the melt transfer point was 120°–125° C., in agreement with the results of Example 10. A circuit board formed by tack transfer at 110° C. and consolidated by reheating 2 min at 135° C. and a board formed by melt transfer printing at 125° C. were copper plated as previously described. The resist had excellent adhesion retention and very few pinholes as judged by copper nodules.

EXAMPLE 12

This example is illustrative of the effect of plasticizer on the transfer window of a toner. Two toners were prepared using the resin described in Example 2. The first consisted of 50 parts resin/50 parts $Fe_3O_4$. The second was 45 parts resin/5 parts triphenyl phosphate/50 parts $Fe_3O_4$. Transfer tests were carried out using the printing system described in Example 1 and heating the circuit board substrates to successively higher temperatures. The transferred images were studied for tack and melt transfer chracteristics. In this experiment, the unplasticized toner was judged to have an acceptable degree of tack transfer temperature at 112°–115° C. and a melt transfer temperature of about 120°–123° C. At 125° C., some sticking of toner to the printing member was occurring. Thus, the transfer window was approximately 10° C.

In tests with the plasticized toner sample under similar test conditions, tack transfer was occurring at 70°–75° C. and melt transfer at 90°–100° C. Thus, the transfer window had widened to about 20° C. or more and the useful temperature range was lowered by 20°–30° C.

EXAMPLE 13

A toner was prepared from a mixture of an acrylic resin, plasticizer and iron oxide in the following manner. The acrylic resin was first prepared by copolymerizing a mixture of methyl methacrylate, ethyl acrylate and methacrylic acid in the ratio of 59, 35, 6 parts by weight. Three parts n-octyl thiol were added to control molecular weight. The monomer solution was added over a 1 hr period to a stirred aqueous polymerization medium containing a surfactant (Duponol ® C "Lorol" sulfate) and ammonium persulfate initiator at 85°–90° C. to yield an acrylic hydrosol which was then partially neutralized with ammonium hydroxide to stabilize it. The finished hydrosol contained about 35 parts by weight acrylic resin.

A portion of the acrylic hydrosol was mixed with magnetic iron oxide (grade MO 7029 purchased from Pfizer Chem. Co.) and aromatic sulfonamide plasticizer (Santicizer ® 8) so that the ratio of resin, plasticizer and $Fe_3O_4$ was in the proportion 45, 5, 50 parts by weight. Additional water was added to make a fluid slurry and the entire mixture was ball-milled overnight to ensure a smooth slurry. Following final adjustment of slurry viscosity, the material was spray dried into a drying chamber to yield a toner similar to that of Example 6 in particle size and having a melt index of 7.7 and Tg of 21° C. The fluid powder was stabilized by dry-mixing it with 0.3 part by weight of powdered silica (Tullanox ® 500).

This toner was tested for resist printing as in the previous examples. Excellent tack transfer occurred at 80°–90° C. In other tests, substantial coalescence during printing occurred at 100°–110° C.

EXAMPLE 14

A toner was prepared by plasticizing a styrene-maleic anhydride resin (SMA ® 1440, purchased from Arco Chem. Co.) having a molecular weight of 1450 with acrylic resins and cinnamic acid and combining the mixture with iron oxide. The proportions of materials by weight were: SMA ® 1440, 32 parts; Carboset ® 514 (Goodrich) styrene/acrylic acid copolymer having a molecular weight of about 30,000 as thermoplastic resins, 8 parts; Carboset ® 515 (Goodrich) styrene/acrylic acid copolymer as the plasticizer (liquid), 8 parts; cinnamic acid, 2 parts; $Fe_3O_4$, 50 parts. The materials were combined and milled on a 2-roll mill to achieve uniform mixing. This blend was subsequently powdered by chopping and then passing it through an air micronizer to achieve a small particle size. Finally, the powder was blown into a spray-drying chamber at a temperature designed just to melt and spherudize the particles. The resultant material was a toner that had a Tg of about 30° C. and, when combined with Tullanox ® 500, was a free-flowing powder at room temperature.

In test printing, this toner showed good tack transfer at 85°–90° C. with coalescence becoming evident by 100°–115° C. In contrast, unplasticized toner from SMA ® 1440 and $Fe_3O_4$ did not exhibit any tack transfer characteristics below 130°–135° C.

The resist compositions of Examples 13 and 14 are both soluble in dilute aqueous ammonia (about 2% concentration) at ordinary room temperature.

As many apparently widely different embodiments of this invention may be made without departing from the spirit and scope thereof, it is to be understood that this invention is not limited to the specific embodiments thereof except as defined in the appended claims.

We claim:

1. A dry particulate resist composition of particles having an average size of 1 to 30 μm, a melt index of 1 to 100 and a glass transition temperature from 25° C. to 100° C., for substantially instantaneous application to a heated surface to form a resist image capable of withstanding modification of an exposed area of said surface, comprising
    (a) a coalescible binder consisting essentially of a thermoplastic resin having a weight average molecular weight of at least 1,000 and less than 50,000 and 2 to 40% of plasticizer based on the weight of said binder, said plasticizer having a boiling point above 200° C., and
    (b) magnetic material having an average particle size of less than 6 μm present in said binder rendering the particles of said composition magnetically attractible, said magnetic material constituting from 40 to 80% by weight of the combination of (a) plus (b) and said binder constituting the remainder,
    the combination of said binder and said magnetic material in said particles rendering them substantially nonblocking at ordinary room temperature and adherent to said surface and coalescible thereon upon said application to said surface to form a resist image, whereby said composition has a tack transfer window greater than 8° C.

2. The composition of claim 1 wherein the magnetic material has a coercivity of less than 400 oersteds.

3. The resist composition of claim 1 having a transfer temperature in the range of 50° to 120° C.

4. The resist composition of claim 1 having a melt index of from 1 to 50.

5. The resist composition of claim 1 having a glass transition temperature of from 25° to 80° C.

6. The resist composition of claim 1 wherein said binder is soluble or swellable in methylene chloride or aqueous alkali at ordinary room temperature.

7. The resist composition of claim 1 wherein said magnetic material is substantially non-porous and isometric in particle shape having an average particle size of 0.1 to 1μ.

8. The resist composition of claim 1 wherein said magnetic material is a non-conductor of electricity.

9. The resist composition of claim 1 wherein said thermoplastic resin has a molecular weight which gives it Newtonian flow character.

10. The resist composition of claim 1 wherein said thermoplastic resin is polyester.

11. The resist composition of claim 1 wherein said thermoplastic resin is acrylic polymer.

12. The resist composition of claim 11 wherein said resin has an acid number of at least 25.

13. A dry resist composition of particles having an average particle size of 1 to 30 μm, and comprising 35 to 65% by wt. of coalescible binder component and 45 to 65% by weight based on the weight of the composition of magnetic material having an average particle size up to 6 μm present in said particles, said binder component composed of thermoplastic polyester resin and 5 to 15% by wt. of plasticizer for said resin based on the total weight of said binder component, said composition being non-blocking at ordinary room temperature and resistant to aqueous $FeCl_3$ etchant and having a melt index of 2 to 100, glass transition temperature of 25° to 110° C. and tack transfer temperature of 50° to 110° C. and tack transfer window of at least 20° C., said resin having a weight average molecular weight of 1,000 to 50,000 and being adherent to copper at said tack transfer temperature.

* * * * *